(12) United States Patent
Wong et al.

(10) Patent No.: US 7,932,152 B2
(45) Date of Patent: Apr. 26, 2011

(54) METHOD OF FORMING A GATE STACK STRUCTURE

(75) Inventors: Will Wong, Singapore (SG); Lap Chan, Singapore (SG); Alan Lek, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 325 days.

(21) Appl. No.: 12/025,789

(22) Filed: Feb. 5, 2008

(65) Prior Publication Data
US 2009/0197387 A1 Aug. 6, 2009

(51) Int. Cl.
*H01L 21/8234* (2006.01)

(52) U.S. Cl. ........ 438/275; 438/277; 257/365; 257/366; 257/E21.637

(58) Field of Classification Search .......... 438/275, 438/199, 277; 257/325, 365, 366, E21.623, 257/E21.637
See application file for complete search history.

(56) References Cited

U.S. PATENT DOCUMENTS

| | | | |
|---|---|---|---|
| 6,147,008 A | 11/2000 | Chwa et al. | |
| 6,355,579 B1 | 3/2002 | Ra | |
| 6,511,887 B1 * | 1/2003 | Yu et al. | 438/275 |
| 6,861,375 B1 | 3/2005 | Nakaoka et al. | |
| 7,091,074 B2 | 8/2006 | Han et al. | |
| 2002/0009851 A1 * | 1/2002 | Shukuri et al. | 438/257 |
| 2003/0008526 A1 * | 1/2003 | Gambino et al. | 438/787 |
| 2004/0224531 A1 | 11/2004 | You et al. | |
| 2005/0003597 A1 * | 1/2005 | Han et al. | 438/197 |
| 2005/0253219 A1 * | 11/2005 | Matsumoto et al. | 257/507 |
| 2006/0043511 A1 * | 3/2006 | Nomura et al. | 257/432 |

FOREIGN PATENT DOCUMENTS

| | | |
|---|---|---|
| JP | 2000174011 | 6/2000 |
| JP | 2006339370 | 12/2006 |

* cited by examiner

*Primary Examiner* — Thanh V Pham
*Assistant Examiner* — Maria Ligai
(74) *Attorney, Agent, or Firm* — Horizon IP Pte Ltd (57) ABSTRACT

A method of forming an integrated circuit structure on a substrate, the substrate includes a primary region and a secondary region. A first layer of a first material of a first thickness is formed over the substrate. A portion of the first layer is removed over the primary region to expose the substrate. The structure is exposed to an oxidizing medium. This forms a second layer, for example, of an oxide material primary region of the substrate. The second layer has a second thickness. Additionally, at least a portion of said first layer is converted to a third layer, for example, of an oxynitride material. The third layer has a third thickness.

25 Claims, 12 Drawing Sheets

METHOD OF FORMING A GATE STACK STRUCTURE

FIELD OF THE INVENTION

The present invention relates to a method of forming a multiple gate transistor device. More particularly, but not exclusively, the invention relates to a method of forming a dual gate FET device and a triple gate FET device.

DESCRIPTION OF THE RELATED ART

In conventional dual gate transistor fabrication schemes, the process of fabricating transistor devices involves the use of polymer photoresist. During the course of fabricating a transistor structure, photoresist is deposited on a gate oxide layer in order to pattern the device structure. When the photoresist is removed, a portion of the underlying gate oxide layer must also be removed in order to ensure that substantially all of the deposited photoresist is removed.

The requirement to ensure that all of the photoresist is removed by over-etching is an undesirable complication in the fabrication of integrated circuits. The yield of integrated circuits may be reduced if complete removal of the photoresist is not accomplished.

SUMMARY OF THE INVENTION

According to a first aspect of the invention there is provided a method of forming an integrated circuit structure on a substrate, the substrate having a primary region and a secondary region, comprising the steps of: forming a first layer of a first thickness over said substrate; removing a portion of said first layer over said primary region to expose a first portion of said substrate; and exposing the structure to an oxidizing medium to form a second layer comprising an oxide material over said first portion of said substrate, said second layer having a second thickness, and to convert at least a portion of said first layer to a third layer comprising an oxynitride material, said third layer having a third thickness.

Reference to a 'substrate' herein is not to be understood as necessarily limited to an uncoated plain wafer such as an uncoated silicon wafer or an uncoated silicon germanium wafer. Rather, reference to a substrate may include reference to a wafer having one or more layers formed thereon.

Embodiments of the invention have the advantage that direct contact between photoresist and gate oxide during a process of fabricating an integrated circuit structure may be avoided.

Embodiments of the invention have the advantage that an amount of deterioration of gate oxide integrity (GOI) is reduced since contact between gate oxide and photoresist is avoided.

Embodiments of the invention have the feature that an oxide layer that will constitute a portion of a gate dielectric of a first gate stack is formed at the same time as an oxynitride layer is formed that will constitute a portion of a gate dielectric of a second gate stack. The oxynitride layer is formed by converting a nitride layer that has already been formed to an oxide layer in the presence of an oxidizing medium. At the same time as the nitride layer is converted to an oxynitride layer, the oxide layer that will constitute a portion of the gate dielectric of the first gate stack is formed. In embodiments of the invention the oxide layer is formed by oxidation of a portion of the substrate. In some embodiments of the invention the oxide layer is formed by oxidation of a layer that was formed prior to exposure of the structure to the oxidizing medium.

In some embodiments of the invention a layer of silicon oxynitride is provided between a gate electrode and a gate oxide layer of a transistor structure. It is known that certain dopant species such as boron which may be used for doping a polysilicon gate electrode tend to diffuse or segregate out of the polysilicon (or 'poly') into the gate oxide when the wafer is exposed to thermal treatment such as annealing and other treatments in which the wafer is heated. This is undesirable since diffusion and/or segregation of dopant atoms tends to adversely affect the threshold voltage of the transistor structure. A parameter for measuring the extent of diffusion/segregation is a negative bias thermal instability (NBTI) parameter.

By inserting the layer of silicon oxynitride between the polysilicon gate electrode and the gate oxide the silicon oxynitride provides a barrier to inhibit diffusion and/or segregation of dopant atoms.

BRIEF DESCRIPTION OF THE DRAWINGS

Embodiments of the present invention will now be described hereinafter, by way of example only with reference to the accompanying drawings, in which.

DETAILED DESCRIPTION OF THE INVENTION

The following embodiments are intended to illustrate the invention more fully without limiting their scope, since numerous modifications and variations will be apparent to those skilled in the art.

Figure 1:
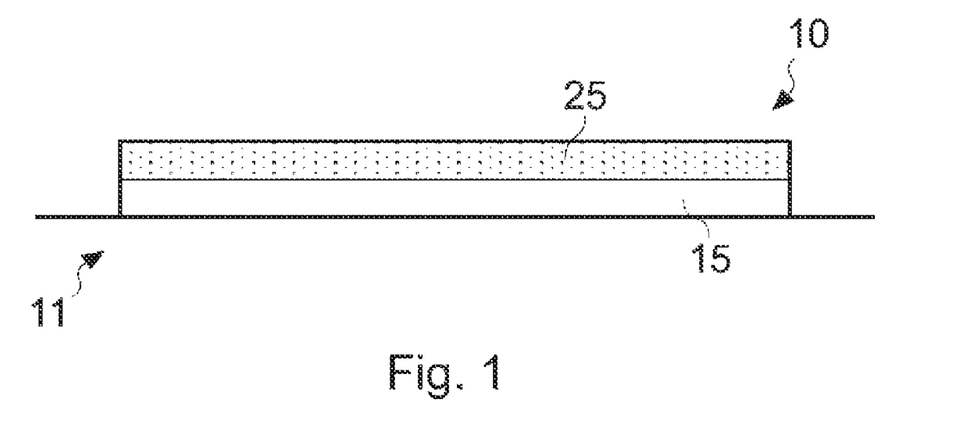
FIGS. 1 to 7 show structures formed during a process of fabricating a transistor structure.

FIG. 1 shows a structure 10 formed during a process of fabricating an integrated circuit according to a first embodiment of the invention. The structure includes a substrate 11, upon which a first layer 15 and a second layer 25 have been formed.

According to the first embodiment the substrate is a silicon wafer. Other substrate materials are also useful. In some embodiments of the invention the substrate 11 is formed from silicon germanium, or any other suitable substrate material.

In one embodiment the first layer is a layer of silicon oxide. Alternatively or in addition other materials suitable for use as a gate dielectric medium may be used such as high-k dielectric materials. The first layer may have a thickness of from about 1 nm to about 2 nm. It is to be understood however that the thickness of the first layer is not limited to that of the preceding example and may be formed to any thickness suitable for the device being formed.

In one embodiment the second layer comprises a layer of silicon nitride. Other types of materials whose characteristics may be modified by an oxidation process may also be useful for forming the second layer, in addition to or instead of silicon nitride. For example, the second layer can comprise polysilicon. The second layer may have a thickness of from about 0.5 nm to about 1 nm. Other thicknesses which allow the second layer to be modified substantially through its thickness are also suitable.

According to the first embodiment the first layer is formed by subjecting the substrate 11 to an oxidizing medium. According to the first embodiment of the invention the oxidizing medium is a mixture of $N_2$ and $O_2$ gas in the ratio 9:1.

The structure is held at a temperature of 900° C. inside a rapid thermal oxidation chamber during the oxidation process.

The second layer is formed by chemical vapour deposition (CVD) using decoupled plasma nitridation (DPN). The DPN process is performed with a chamber pressure in the range from about 5 to about 20 mTorr, a nitrogen flow rate of about 100 to about 200 sccm and a plasma power of about 300 W. Other process conditions are useful. Other deposition process techniques are also useful.

Figure 2:
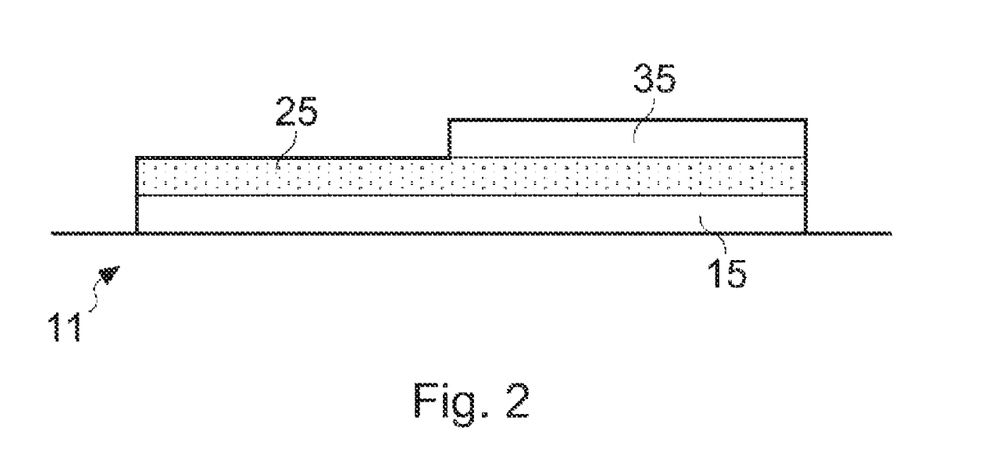

FIG. 2 shows the structure of FIG. 1 following the formation of a patterned blocking layer 35 over the second layer 25. According to the first embodiment of the invention the blocking layer 35 is a hardmask resist layer. The hard mask, for example, comprises silicon oxide and is about 10 nm in thickness. Other thicknesses of the silicon oxide layer are also useful. Furthermore, materials other than silicon oxide are also useful for forming the blocking layer 35. The hard mask is patterned using a photoresist mask. According to a second embodiment of the invention, the blocking layer 35 is formed from a photoresist material.

Figure 3:
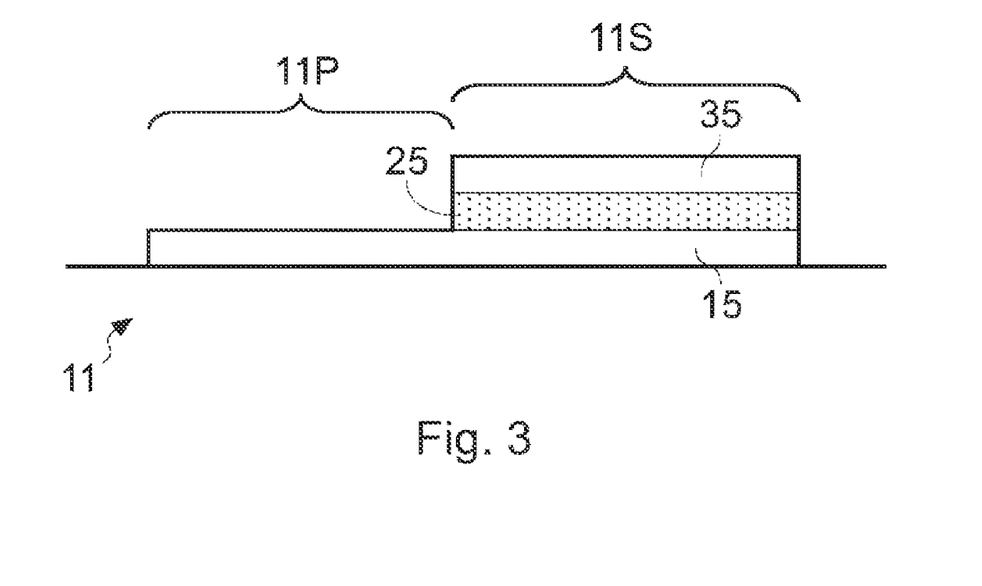

FIG. 3 shows the structure of FIG. 2 following a process of etching of the structure of FIG. 2 to remove a portion of the second layer 25 unprotected by the blocking layer 35, i.e. a portion of the second layer overlying a primary region 11P of the substrate 11. The exposed portion of the second layer 25 is removed by etching. The etch process selectively etches the second layer with respect to the hard mask. For example, the etch process selectively etches silicon nitride and not silicon oxide.

In one embodiment, the etch process comprises a wet etch process. Preferably, the etch process exposes the substrate to H3PO4 to remove the exposed silicon nitride while leaving the hard mask or silicon oxide. Other types of etching processes are also useful, for example, reactive ion etching (RIE).

Figure 4:
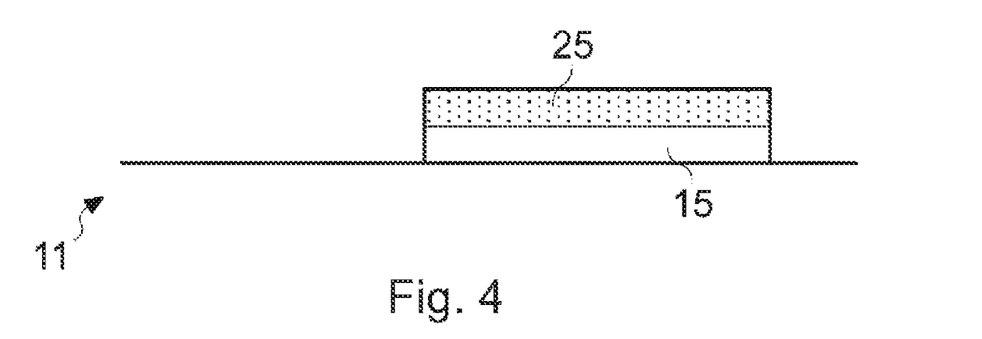

FIG. 4 shows the structure of FIG. 3 following a process of removal of the patterned silicon oxide blocking layer 35 and an exposed portion of the first layer 15 of silicon oxide, i.e. a portion of the first layer not underlying a remaining portion of the second layer 25. The process of removal involves a wet etching process wherein the structure of FIG. 3 is exposed to a hydrofluoric acid solution to remove exposed silicon oxide.

In an alternative embodiment, the hard mask and first layer are formed form different materials. In such cases, the etch process can selectively remove both the second and first layers in the primary region while leaving the hard mask protecting the layers in the secondary region. The hard mask can be removed in a separate etch process.

The primary region 11P of the substrate 11 is exposed following removal of the exposed portion of the first layer 15. In one embodiment, this is the region of the substrate over which a thin gate structure being a single gate (SG) structure will be formed.

Figure 5:
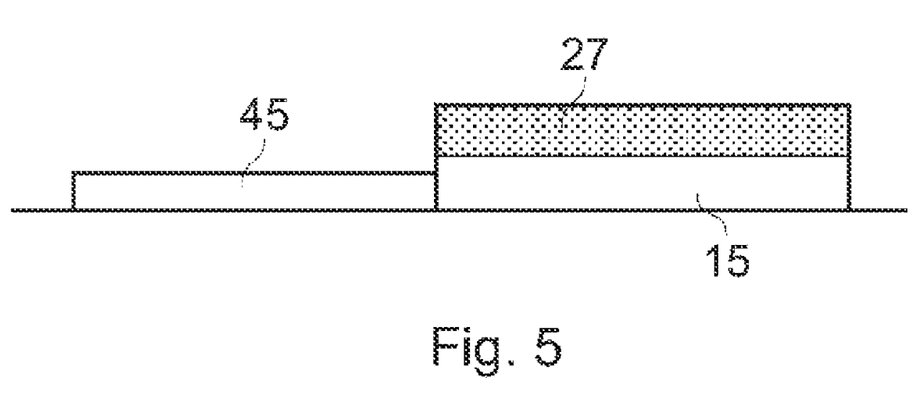

FIG. 5 shows the structure of FIG. 4 following exposure of the structure of FIG. 4 to an oxidizing medium. According to the first embodiment of the invention the oxidizing medium is a mixture of $N_2$ and $O_2$ gas in the ratio 9:1. The structure is held at a temperature of 900° C. inside a rapid thermal oxidation chamber during the oxidation process. Other types of oxidizing ambients are also useful. In some embodiments, a decoupled plasma nitridation process is then performed.

During exposure to the oxidizing medium, the second layer 25 is converted from a layer of silicon nitride to a layer of silicon oxynitride 27. Furthermore, a fourth layer 45 is formed at the exposed surface of the substrate 11. According to the first embodiment the fourth layer 45 is a layer of silicon oxide.

The fourth layer 45 is from about 1 to about 2 nm in thickness, whilst the layer of silicon oxynitride 27 is about 1 nm in thickness. It will be appreciated that other thickness are also useful. Furthermore, it will be appreciated that other materials are also useful.

In some embodiments of the invention a further layer of a high-k dielectric material is subsequently formed over the structure.

By high-k dielectric material is meant a material having a dielectric constant that is higher than that of silicon oxide. For example, the high-k dielectric material may be hafnium oxide ($HfO_2$), a hafnium silicate ($HfSiO_xN$) or any other suitable high-k dielectric material. The high-k dielectric material may be formed by atomic layer deposition at a temperature of from about 300 to about 350° C. at a pressure of 1 Torr. It will be understood that other process for forming the high-k dielectric material are also useful.

Figure 6:
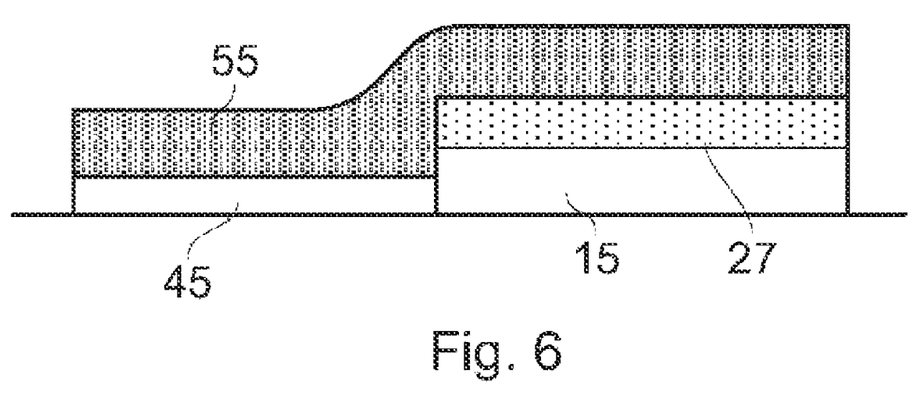

FIG. 6 shows the structure of FIG. 5 following a process of forming a gate electrode layer 55 over the structure of FIG. 5. The gate electrode layer 55 is formed from polycrystalline silicon (polysilicon) having a thickness of from about 120 to about 160 nm. Other thicknesses and gate electrode materials are also useful.

Figure 7:
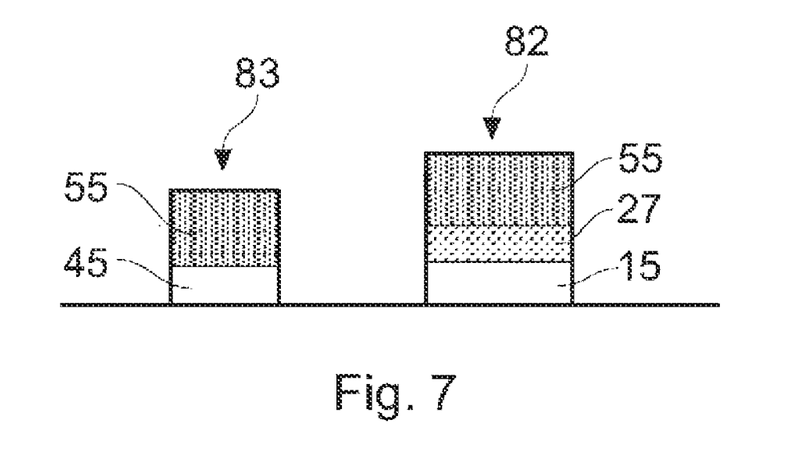

FIG. 7 shows the structure of FIG. 6 following a process of patterning the structure of FIG. 6 to form first and second sets of gate stack structures 83, 82 respectively. According to the present embodiment the gate stack structure indicated at 83 is a single gate (SG) gate stack structure and the gate stack structure indicated at 82 is a double gate (DG) gate stack structure.

In the embodiment of FIG. 7 gate stack structures having a structure corresponding to the first set of gate stack structures 83 have a gate dielectric region formed from a layer of silicon oxide having a thickness of from about 1 to about 2 nm.

In the embodiment of FIG. 7 gate stack structures having a structure corresponding to the second set of gate stack structures 82 have a gate dielectric region formed from a layer of silicon oxide about 2 nm in thickness and a layer of silicon oxynitride about 1 nm in thickness.

According to a second embodiment of the invention, a process of fabricating an integrated circuit structure is substantially as described with respect to the first embodiment of the invention. However, in a process according to the second embodiment, the blocking layer 35 is formed from a photoresist material. According to the second embodiment, the photoresist material is a polymer photoresist material. Other photoresist materials are also useful.

It will be appreciated that a process of removal of the blocking layer 35 of polymer photoresist material in a process according to the second embodiment of the invention may be performed in a separate step to a process of removal of the exposed portion of the first layer 15 of silicon oxide.

A process of fabricating an integrated circuit according to the first or second embodiments of the invention has the advantage that a surface of an oxide layer that will form part of the gate dielectric structure of a transistor device does not experience direct contact with a resist material during the fabrication process. This has the advantage of improving a level of gate oxide integrity of a transistor device formed according to the first or second embodiments of the invention.

Figure 8:
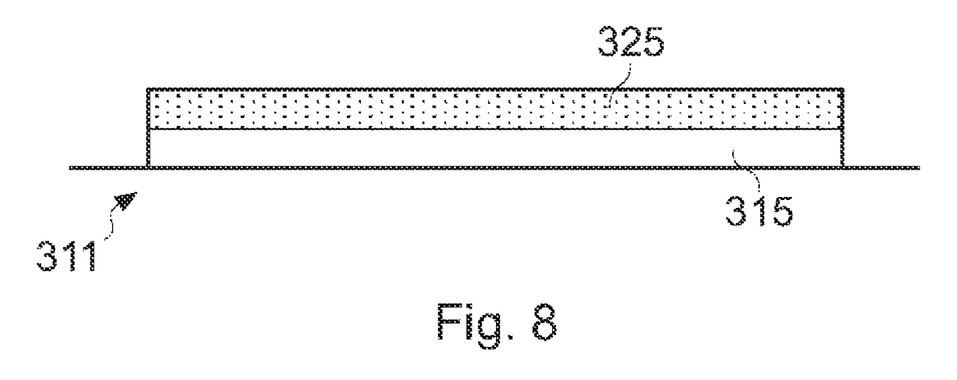
FIGS. 8 to 16 show structures formed during a process of fabricating a transistor structure.

FIG. 8 shows a structure formed during a process of fabricating a structure according to a third embodiment of the invention. The structure of FIG. 8 includes a substrate 311 over which a first layer 315 and subsequently a second layer 325 have been formed.

As in the case of the first and second embodiments, the substrate 311 according to the third embodiment is formed from silicon. The first layer 315 is formed from silicon oxide and the second layer 325 is formed from silicon nitride. It will be appreciated that other functionally equivalent substrates and layer materials are also useful.

The first layer is formed to have a thickness of about 2 nm and the second layer is formed to have a thickness of about 1 nm. Other thicknesses are also useful.

As in the case of the first and second embodiments, the first layer 315 is formed by exposing the substrate 311 to an oxidizing medium whilst the second layer 325 is formed by CVD using decoupled plasma nitridation (DPN). The DPN process is performed with a chamber pressure in the range from about 5 to about 20 mTorr, a nitrogen flow rate of 100-200 sccm and a plasma power of about 300 W.

Figure 9:
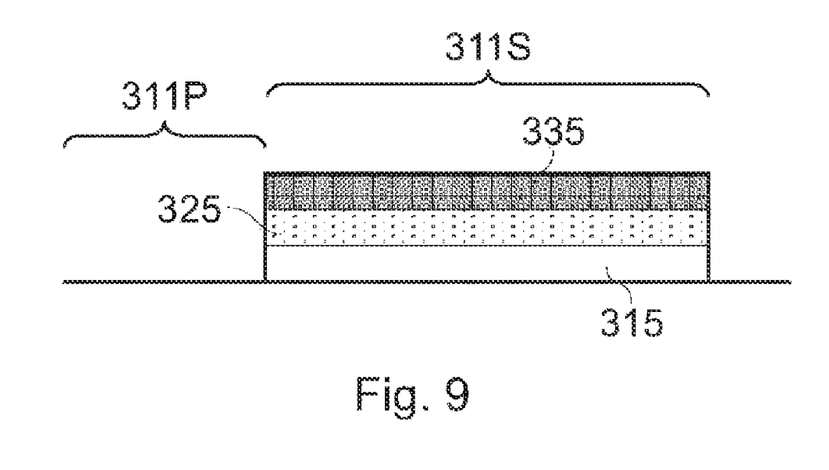

FIG. 9 shows the structure of FIG. 8 following a process of forming a blocking layer 335 over the second layer 325, patterning the blocking layer to expose a portion of the second layer 325 overlying a primary portion 311P of the substrate, and removing portions of the first and second layers 315, 325 overlying the primary portion of the substrate. A secondary portion 311S of the substrate 311 remains coated by respective remaining portions of the first layer 315 and the second layer 325.

According to the third embodiment the blocking layer 335 is a layer of photoresist.

According to the third embodiment of the invention, the process of removing the portions of the first and second layers 315, 325 overlying the primary portion 11P of the substrate is performed by means of a reactive ion etch process. Other etch processes are also useful.

Figure 10:
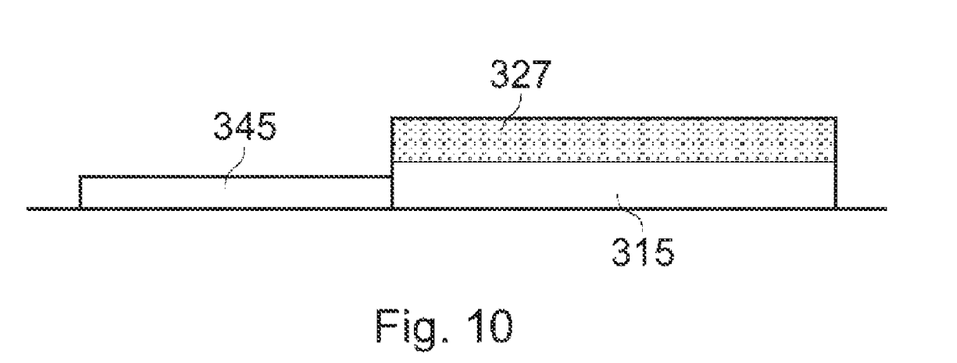

FIG. 10 shows the structure of FIG. 9 following a process of removal of the blocking layer 335 and exposure of the structure to an oxidizing medium.

Exposure of the structure to the oxidizing medium results in conversion of the second layer 325 from a layer of silicon nitride to a layer of silicon oxynitride 327. Furthermore, exposure of the structure to the oxidizing medium results in the formation of a fourth layer 345 at the exposed surface of the primary region 311P of the substrate 311.

According to the third embodiment the fourth layer 345 is a layer of silicon oxide about 2 nm in thickness, whilst the layer of silicon oxynitride 327 is about 1 nm in thickness. It will be appreciated that other thickness are also useful. Furthermore, it will be appreciated that other materials are also useful.

Figure 11:
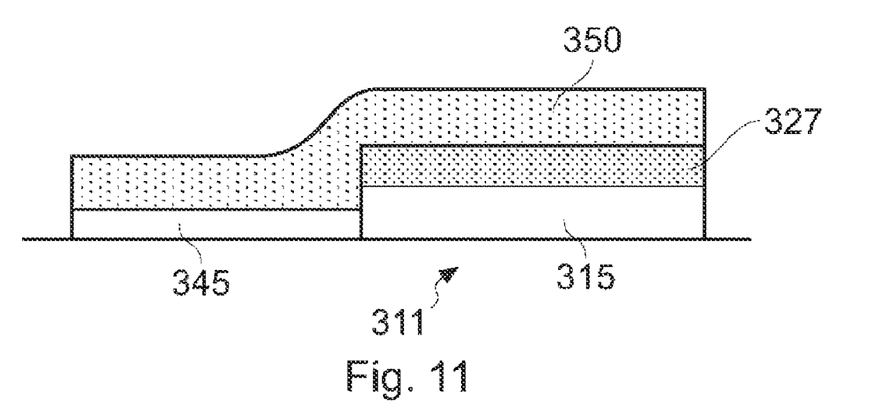

FIG. 11 shows the structure of FIG. 10 following a process of forming a fifth layer 350 over the structure of FIG. 10. According to the third embodiment, the fifth layer 350 is a layer of silicon nitride. Other materials are also useful.

The fifth layer 350 is formed to have a thickness of about 1 nm. Other thicknesses are also useful. The fifth layer is formed using a similar process to the second layer 325. That is, the fifth layer 350 is formed by CVD using decoupled plasma nitridation (DPN). The DPN process was performed with a chamber pressure in the range from about 5 to about 20 mTorr, a nitrogen flow rate of 100-200 sccm and a plasma power of about 300 W. Other processes for forming the fifth layer are useful.

Figure 12:
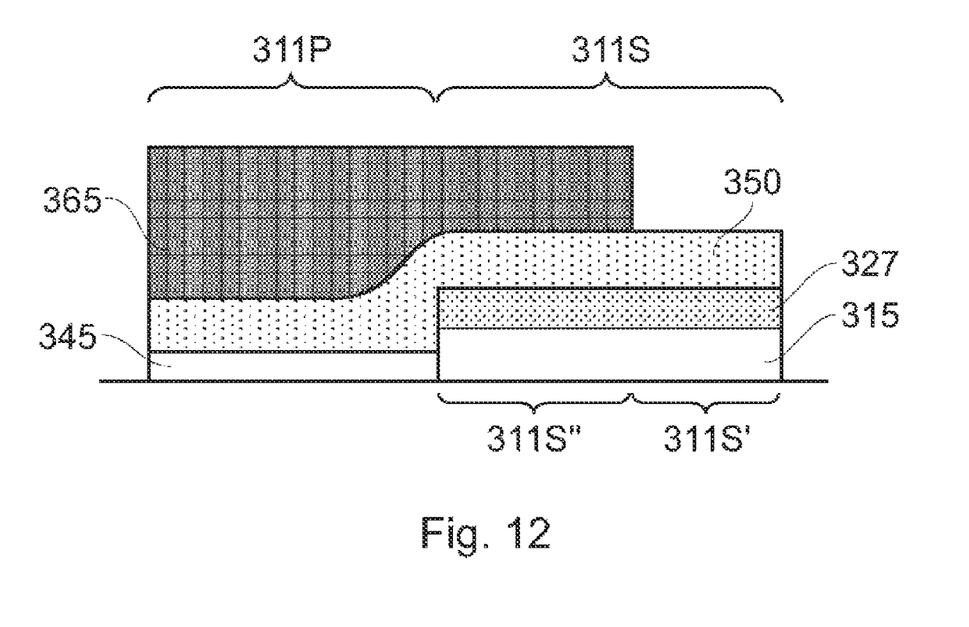

FIG. 12 shows the structure of FIG. 11 following a process of forming a resist layer 365 over the structure of FIG. 11, and patterning the resist layer 365 to expose a portion of the underlying fifth layer 350. The portion of the underlying fifth layer 350 exposed is a portion overlying a single gate (SG) portion 311S' of a secondary region 311S of the substrate 311. The secondary region 311S is a region distinct from the primary region 311P of the substrate 311.

A portion of the fifth layer 350 overlying a double gate (DG) portion 311S" of the secondary region 311S of the substrate 311 remains covered by a portion of resist layer 365 following the patterning process. A portion of the fifth layer 350 overlying the primary region 311P of the substrate 311 also remains covered by a portion of resist layer 365 following the patterning process. The primary region 311P corresponds to an extended gate (EG) portion of the substrate upon which an extended gate structure will be provided.

Figure 13:
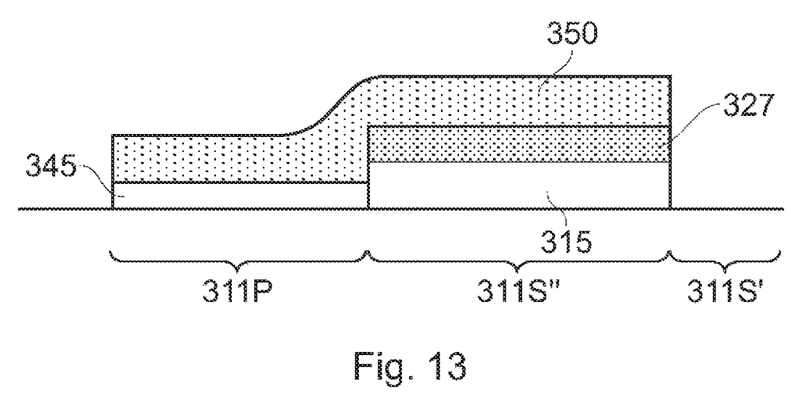

FIG. 13 shows the structure of FIG. 12 following a process of sequentially etching the structure to remove portions of the fifth, second and first layers 350, 327, 315 overlying the single gate portion 311S' of the secondary region of the substrate 311S. After the process of etching is complete, the single gate portion 311S' of the substrate is exposed. The resist layer 365 is then removed.

Figure 14:
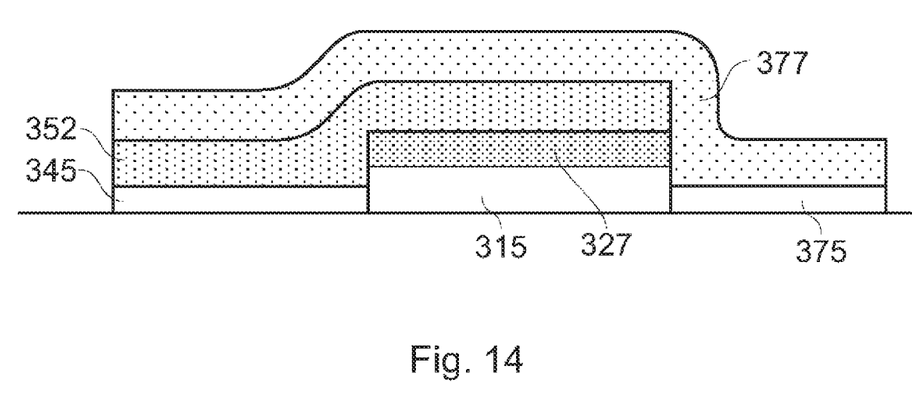

FIG. 14 shows the structure of FIG. 13 following a process of exposing the structure of FIG. 13 to an oxidizing medium and subsequently forming a layer of a high-k dielectric medium 377 over the structure.

The process of exposing the structure to an oxidizing medium results in the formation of a seventh layer 375 at the surface of the single gate portion 311S' of the substrate. The process also results in conversion of the fifth layer 350 to an oxynitride layer 352.

According to the third embodiment the seventh layer 375 is formed from silicon oxide. In one embodiment the silicon oxide is formed by rapid thermal oxidation and has a thickness of from about 1 nm to about 2 nm. Other thicknesses are useful. Furthermore other materials are also useful that may be formed by exposure of the substrate to an oxidizing medium.

In the embodiment shown in FIG. 14 the layer of high-k dielectric material 377 is a layer of hafnium oxide ($HfO_2$). Other high-k dielectric materials are also useful such as hafnium silicate ($HfSiO_xN$). In some embodiments the layer of high-k dielectric material is formed by atomic layer deposition at a temperature of from about 300 to about 350° C., at a pressure of about 1 Torr. In some embodiments the layer is formed to be about 1 nm in thickness. Other thicknesses are also useful. Furthermore, other high-k dielectric materials are also useful.

In some embodiments, no high-k dielectric layer 377 is formed.

Figure 15:
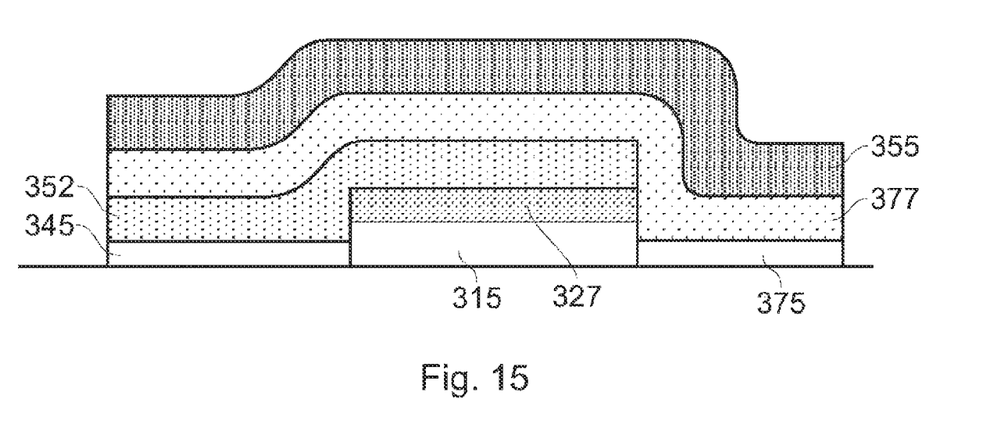

FIG. 15 shows the structure of FIG. 14 following a process of forming a gate electrode layer 355 over the structure. The gate electrode layer 355 is formed from polycrystalline silicon (polysilicon) having a thickness of from about 120 to about 160 nm. Other gate electrode materials are useful. Other gate electrode thicknesses are also useful.

Figure 16:
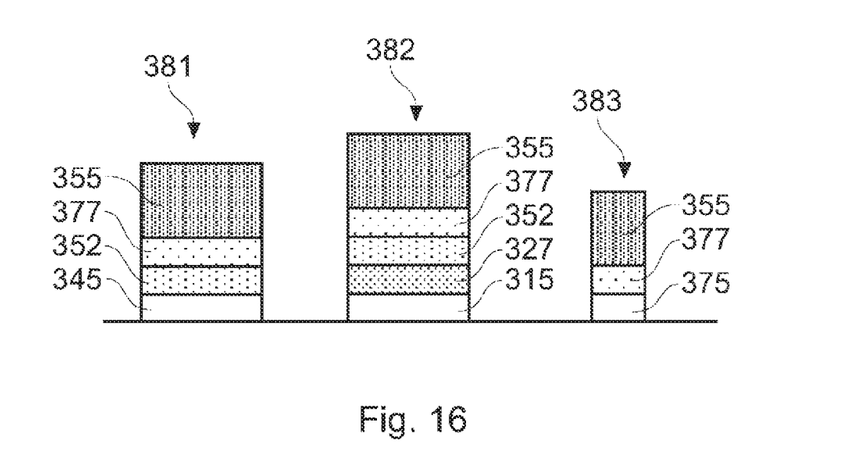

FIG. 16 shows the structure of FIG. 15 following a process of patterning the structure of FIG. 15 to form first, second and third gate stack structures 381, 382, 383.

Gate stack structures having a structure corresponding to the first gate stack structure 381 are of EG type and have a gate dielectric region formed from a layer of silicon oxide 345 about 2 nm in thickness and a layer of silicon oxynitride 352 about 1 nm in thickness. In embodiments having a layer of a high-k dielectric material, the layer of high-k dielectric material 377 in the EG gate dielectric region is about 1 nm in thickness.

Gate stack structures having a structure corresponding to the second gate stack structure 382 are of DG type and have a gate dielectric region formed from a layer of silicon oxide 315 about 2 nm in thickness and a layer of silicon oxynitride 327, 352 about 2 nm in thickness. In embodiments having a layer of a high-k dielectric material, the layer of high-k dielectric material 377 in the DG gate dielectric region is about 1 nm in thickness.

Gate stack structures having a structure corresponding to the third gate stack structure 383 are of SG type and have a gate dielectric region formed from a layer of silicon oxide 375 having a thickness of from about 1 to about 2 nm. In embodiments having a gate dielectric having a layer of a high-k dielectric material, the layer of high-k dielectric material 377 has a thickness of about 1 nm.

Structures formed according to the third embodiment have the advantage that resist material does not directly contact an oxide layer used in the formation of a gate dielectric region of an EG, SG or DG gate stack structure.

It is to be appreciated that the present description refers to the fabrication of only one gate stack structure of each type (for example, a DG, an SG and an EG type). The skilled person will appreciate that integrated circuit structures will generally comprise many gate stack structures of each type.

Figure 17:
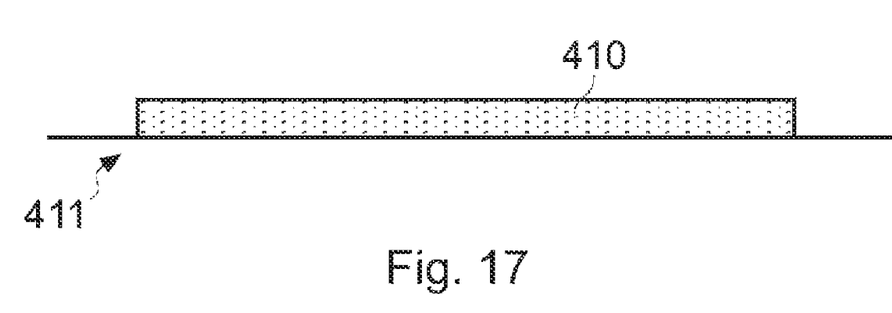
FIGS. 17 to 23 show structures formed during a process of fabricating a transistor structure.

FIG. 17 shows a structure formed during a process of fabricating an integrated circuit according to a fourth embodiment of the invention. The structure of FIG. 17 has a substrate 411 having a first layer 410 formed thereon. According to the fourth embodiment the first layer 410 is formed from silicon nitride about 1 nm in thickness. Other thicknesses of silicon nitride are also useful. Other materials are also useful for forming the first layer 410.

Figure 18:
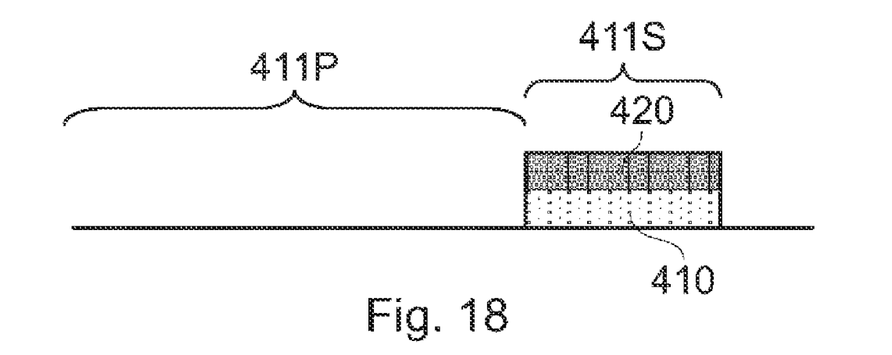

FIG. 18 shows the structure of FIG. 17 following a process of forming a blocking layer 420 over the first layer 410, patterning the blocking layer 420 to expose a portion of the first layer 410, and etching the exposed portion of the first layer 410 to expose a primary portion 411P of the substrate. A secondary portion 411S of the substrate 411 remains coated by the first layer 410. The secondary portion 411S of the substrate 411 corresponds to a portion of the substrate over which a single gate (SG) gate structure will be fabricated.

According to the fourth embodiment the blocking layer 420 is a layer of a photoresist material. In alternative embodiments of the invention the blocking layer 420 is formed from a hard mask material such as silicon oxide. Other materials are also useful for forming the blocking layer 420.

Figure 19:
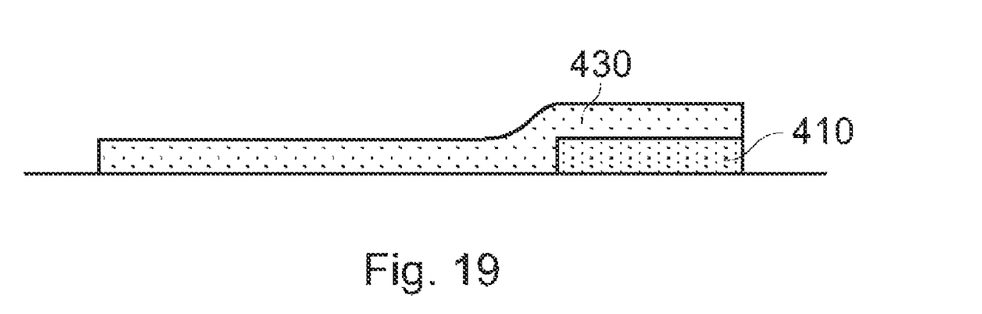

FIG. 19 shows the structure of FIG. 18 following a process of removal of the blocking layer 420 and forming a third layer 430 over the resulting structure. The third layer 430 is formed from silicon nitride about 1 nm in thickness. Other thicknesses of silicon nitride are also useful. Furthermore, other materials are also useful.

Figure 20:
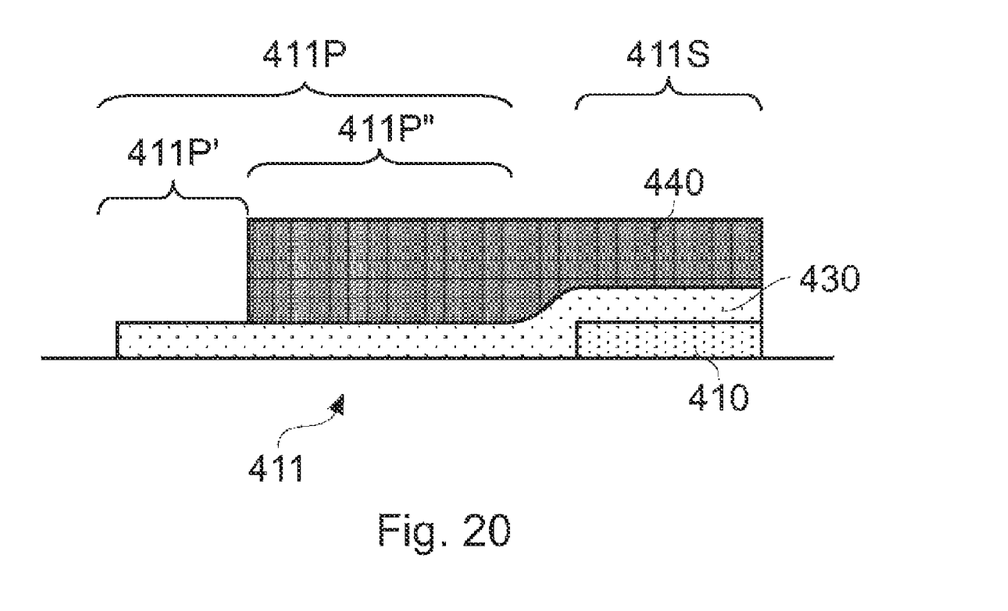

FIG. 20 shows the structure of FIG. 19 following a process of forming a fourth layer 440 over the structure of FIG. 19. The fourth layer is a layer of a blocking medium. According to the fourth embodiment the blocking medium is a photoresist material. In alternative embodiments the blocking medium is a hard mask material such as silicon oxide or any other suitable hard mask material.

As shown in FIG. 20, the fourth layer 440 is patterned to expose a portion of the third layer 430 overlying a double gate (DG) portion 411P' of the primary region 411P of the substrate 411. The DG portion 411P' of the primary region of the substrate corresponds to a portion of the substrate 411 over which a DG gate structure will be formed.

Subsequently, the exposed portion of the third layer 430 is removed by an etch process to expose the surface of the DG portion 411P' of the primary region of the substrate 411. According to the fourth embodiment the etch process is a wet etch process wherein the structure is exposed to hot phosphoric acid solution ($H_3PO_4$).

A remaining portion of the third layer 430 not overlying the first layer 410 overlies an extended gate (EG) portion 411P''' of the primary region 411P of the substrate. This is a portion of the substrate over which an EG gate structure will be formed.

Figure 21:
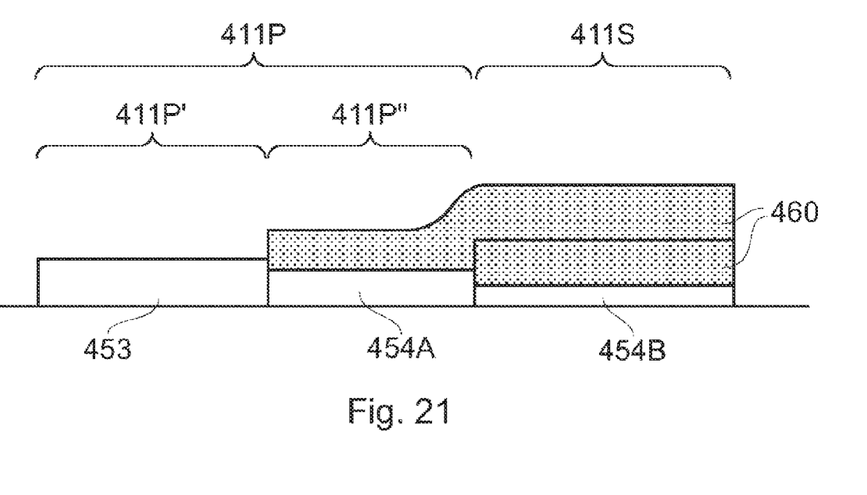

FIG. 21 shows the structure of FIG. 20 following a process of removal of remaining portions of the fourth layer 440 and exposure of the resulting structure to an oxidizing medium. The process of exposure of the structure to an oxidizing medium is substantially as described above with respect to other embodiments of the invention.

Exposure to the oxidizing medium is performed in order to form a layer of silicon oxide 453 about 4 nm in thickness over the DG portion 411P' of the primary region of the substrate.

Exposure to the oxidizing medium also results in conversion of the remaining portions of the first and third layers 410, 430 to a silicon oxynitride layer 460. A layer of silicon oxide 454 is also formed below the silicon oxynitride layer 460. This is due to diffusion of oxygen through the silicon oxynitride layer 460 and/or the first and third layers 410, 430 to the substrate and conversion of a portion of the silicon substrate to silicon oxide as these layers become converted to silicon oxynitride.

The portion of the silicon oxide layer 454A above the EG portion of the primary region is thicker than the portion 454B over an SG portion (corresponding to a secondary region 411S of the substrate). This is because the portion of the silicon oxynitride layer 460 above the SG portion is thicker than that over the EG portion resulting in a reduced amount of diffusion of oxygen species to the substrate.

In a method according to the present embodiment, the oxide thicknesses above the EG and SG regions (below the oxynitride layer 460) are approximately 5 Angstroms and 3 Angstroms, respectively.

Figure 22:
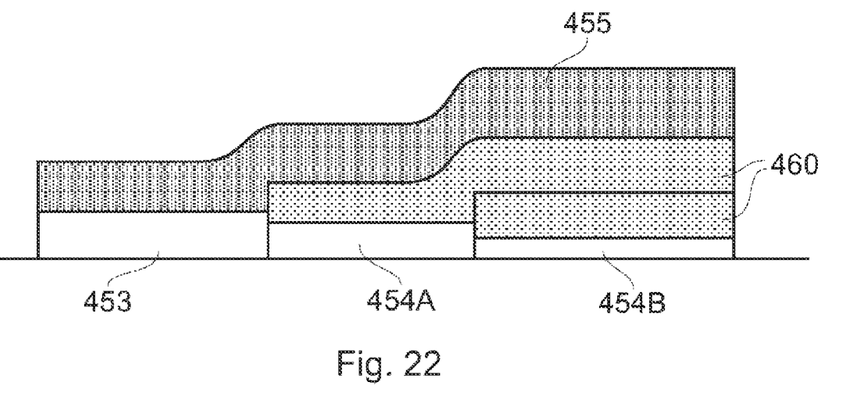

FIG. 22 shows the structure of FIG. 21 following a process of forming a gate electrode layer 455 over the structure. The gate electrode layer 455 is formed from a layer of polycrystalline silicon (polysilicon) having a thickness from about 120 to about 160 nm. Other gate electrode materials are useful. Other gate electrode layer thicknesses are also useful.

Figure 23:
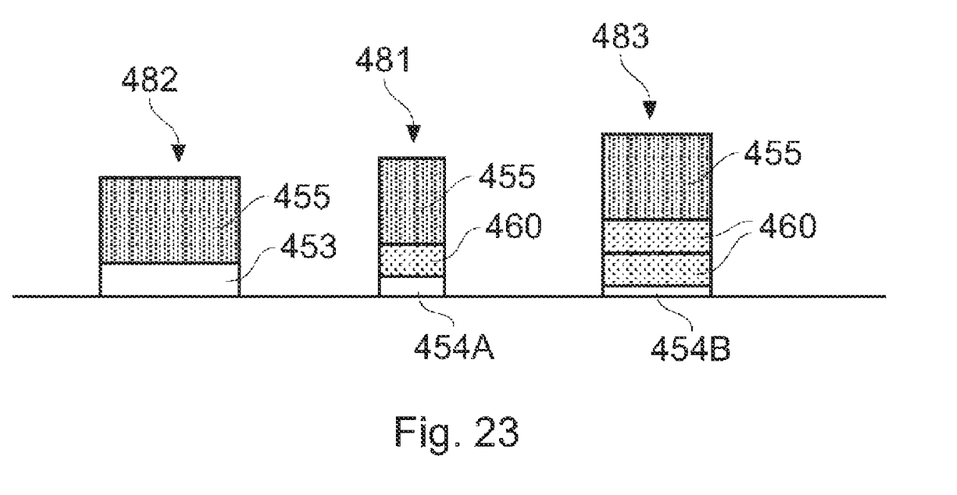

FIG. 23 shows the structure of FIG. 22 following a process of patterning the structure to form a DG gate structure 482, an EG gate structure 481 and an SG gate structure 483 over respective portions of the substrate. That is, the DG gate structure 482 is formed over the DG gate portion 411P' of the substrate 411, the EG gate structure 481 is formed over the EG gate portion 411P''' of the substrate 411 and the SG gate structure 483 is formed over the SG gate portion 411S of the substrate 411.

In a method according to the present embodiment, three gate stack structures each having a different gate oxide thickness may be fabricated in a process having a single oxidation step. Furthermore, three gate structures each having a different gate dielectric thickness may be fabricated in a process having a single oxidation step.

Gate stack structures having different thicknesses of gate oxide are formed because oxygen takes longer to diffuse through thicker oxynitride layers than through thinner oxynitride layers. As discussed above, the oxynitride layer above the SG region is thicker than the oxynitride layer above the EG region, and consequently the silicon oxide layer above the SG region is thinner than the silicon oxide layer above the EG region.

Embodiments of the invention described herein have the advantage that direct contact between a resist material and an oxide material from which a gate dielectric will be formed does not occur. This has the advantage that a reduction in gate oxide integrity due to contact between an oxide material from which a gate dielectric will be formed and a resist material is avoided.

In addition, some embodiments of the invention provide a one-step oxidation process to create three different transistor structures with three different respective gate oxide thicknesses. In other words, some embodiments of the invention provide a method of forming three different transistors with three different gate oxide thicknesses in which only one step in the fabrication process requires exposure of a fabrication to an oxidizing medium. In some cases such a process can significantly reduce the cost of production of such transistor devices. In some cases such a process can improve a yield of working transistor devices. In some cases such a process can reduce the cycle time of the manufacturing process.

It is to be understood that for the purposes of clarity of the figures, portions of the substrate that are converted from one material to another by exposure to an oxidizing medium are illustrated as being formed above a nominal surface of the substrate. It is to be appreciated that in some embodiments at least a part of one or more of these portions may in fact be at least partially below the nominal surface of the substrate.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

What is claimed is:

1. A method of forming an integrated circuit structure comprising:
   providing a substrate having a primary region and a secondary region, wherein the primary region of the substrate has a double gate (DG) portion and a single gate (SG) portion, and said secondary region corresponds to an extended gate (EG) portion of the substrate;
   forming a first layer of a first thickness over said substrate;
   removing a portion of said first layer to expose a first portion of said substrate;
   exposing the structure to an oxidizing medium to form a second layer comprising an oxide material over said first portion of said substrate, said second layer having a second thickness, and to convert at least a portion of said first layer to a third layer comprising an oxynitride material, said third layer having a third thickness; and
   forming a fourth layer over said SG portion and over said EG portion of the substrate and not over said DG portion of the substrate.

2. The method as claimed in claim 1 wherein:
   forming the first layer is preceded by forming the fourth layer above said substrate, said fourth layer comprising an oxide material, said fourth layer having a fourth thickness; and
   removing a portion of said first layer further comprises removing a portion of said fourth layer exposed when said portion of said first layer is removed to expose said first portion of said substrate.

3. The method as claimed in claim 2 wherein exposing the structure is followed by forming a polysilicon layer over said structure.

4. The method as claimed in claim 3 further comprises patterning the structure to form at least one gate structure.

5. The method as claimed in claim 3 comprises patterning the structure to form:
   a gate structure in said primary region;
   a gate structure in said secondary region; and
   wherein said gate structure in said primary region has a gate dielectric portion comprising an oxide layer of said second thickness, and said gate structure in said secondary region has a gate dielectric portion comprising an oxide layer of said second thickness and an oxynitride layer of said third thickness.

6. The method as claimed in claim 2 wherein exposing the structure is followed by forming a fifth layer over said structure, said fifth layer comprising a dielectric material.

7. The method as claimed in claim 2 wherein said fourth layer comprises silicon oxide.

8. The method as claimed in claim 1 wherein removing a portion of said first layer comprises:
   coating the structure with a layer of resist material;
   patterning said resist material;
   subsequently, etching said first layer; and
   subsequently, removing said resist material.

9. The method as claimed in claim 8 wherein said resist material comprises photoresist or an oxide material.

10. The method as claimed in claim 1 wherein:
    said fourth layer comprises a nitride material; and
    exposing the structure further comprises converting said fourth layer to a fifth layer, said fifth layer comprising an oxynitride material, said fifth layer having a fifth thickness.

11. The method as claimed in claim 10 further comprises subsequently coating the structure with a gate electrode material.

12. The method as claimed in claim 11 comprises patterning the structure to form:
    a DG gate stack over said DG portion of the substrate;
    an SG gate stack over said SG portion of the substrate; and
    an EG gate stack over said EG portion of the substrate, wherein
    said DG gate stack comprises a DG gate dielectric comprising a portion of said second layer,
    said SG gate stack comprises an SG gate dielectric comprising a portion of said fifth layer, and
    said EG gate stack comprises an EG gate dielectric comprising a portion of said fifth layer and a portion of said third layer.

13. The method as claimed in claim 12 wherein converting said fourth layer to a fifth layer further comprises forming a seventh layer, the seventh layer comprising an oxide material, the seventh layer being formed from a portion of said substrate underlying said fourth layer and said first layer.

14. The method as claimed in claim 13 wherein said SG gate dielectric and said EG gate dielectric each comprise a respective portion of said seventh layer.

15. The method as claimed in claim 1 wherein:
    said substrate comprises a silicon wafer;
    said first layer comprises silicon nitride; and
    said second layer comprises silicon oxide.

16. A method of forming an integrated circuit structure comprising:
- providing a substrate having a primary region and a secondary region, wherein the primary region of the substrate has an extended gate (EG) portion, and the secondary region has a double gate (DG) portion and a single gate (SG) portion;
- forming a first layer of a first thickness over said substrate;
- removing portion of said first layer to expose a first portion of said substrate;
- exposing the structure to an oxidizing medium to form a second layer comprising an oxide material over said first portion of said substrate, said second layer having a second thickness, and to convert at least a portion of said first layer to a third layer comprising an oxynitride material, said third layer having a third thickness;
- forming a fourth layer over said DG and SG portions of the substrate and not over said EG portion of the substrate;
- forming a fifth layer over said structure;
- removing portion of said fourth, third and fifth layers overlying the SG portion of said secondary region and not removing portions of said fourth, third and fifth layers overlying the DG portion of said secondary region; and
- subsequently, forming a sixth layer over said SG portion, said sixth layer comprising an oxide material.

17. The method as claimed in claim 16 wherein forming said sixth layer comprises exposing said structure to an oxidizing medium.

18. The method as claimed in claim 17 wherein:
- said fifth layer comprises a nitride material; and
- exposing the structure to an oxidizing material comprises converting said fifth layer to an oxynitride material.

19. The method as claimed in claim 18 comprises subsequently coating the structure with a gate electrode material.

20. The method as claimed in claim 19 comprises patterning the structure to form:
- an EG gate structure over said primary region;
- a DG gate structure over the DG portion of the secondary region; and
- a SG gate structure over the SG portion of the secondary region, and wherein
  - said EG gate structure has a gate dielectric portion comprising a portion of said second layer and a portion of said fifth layer,
  - said DG gate structure has a gate dielectric portion comprising a portion of said fourth, third and fifth layers, and
  - said SG gate structure has a gate dielectric portion comprising a portion of said sixth layer.

21. A method of forming an integrated circuit structure, the method comprises:
- providing a substrate having a first region and a second region, wherein the second region comprises first and second sub-second regions;
- forming a first dielectric layer on the substrate, wherein the first dielectric layer comprises a second sub-first dielectric layer over a first sub-first dielectric layer;
- removing a portion of the first dielectric layer on the substrate in the first region to expose a surface of the substrate in the first region and leaving a remaining portion of the first dielectric layer on the substrate in the second region; and
- forming a second dielectric layer on the substrate in the first region, wherein forming the second dielectric layer converts the second sub-first dielectric layer to oxynitride;
- forming a third dielectric layer on the substrate, the third dielectric layer comprising a conformal dielectric layer covering the first and second regions, wherein a second height of a top surface of the third dielectric layer in the second region is greater than a first height of the top surface of the third dielectric layer in the first region, wherein at least the third dielectric layer serves as gate dielectrics of different transistors in the first and second regions;
- patterning the first and third dielectric layers in the second sub-second region to expose the substrate in the second sub-second region;
- forming a fourth dielectric layer on the exposed substrate in the second sub-second region;
- wherein the third dielectric layer comprises silicon nitride;
- wherein forming the fourth layer comprises thermal oxidation; and
- the thermal oxidation converts the third dielectric layer to silicon oxynitride.

22. The method of claim 21 further comprises forming a fifth dielectric layer on the substrate, the fifth dielectric layer covering the second and fourth dielectric layers.

23. The method of claim 21 comprises:
- forming a gate electrode layer over the substrate; and
- patterning to form first, second and third gate structures in the first region and the first and second sub-second regions.

24. A method of forming an integrated circuit structure, the method comprises:
- providing a substrate having a first region and a second region, wherein the first region comprises first and second sub-first regions;
- forming a first dielectric layer on the substrate;
- removing a portion of the first dielectric layer on the substrate in the first region to expose a surface of the substrate in the first region and leaving a remaining portion of the first dielectric layer on the substrate in the second region; and
- forming a second dielectric layer on the substrate, the second dielectric layer comprising a conformal dielectric layer covering the first and second regions, wherein a second height of a top surface of the second dielectric layer in the second region is greater than a first height of the top surface of the second dielectric layer in the first region, wherein at least the second dielectric layer serves as gate dielectrics of different transistors in the first and second regions;
- patterning the second dielectric layer to expose the substrate in the first sub-first region;
- forming a third dielectric layer on the exposed substrate in the first sub-first region;
- wherein the first and second dielectric layer comprises silicon nitride; and
- forming the third dielectric layer comprises thermal oxidation, wherein the thermal oxidation converts the first and second dielectric layers into silicon oxynitride and forms fourth and fifth dielectric layers on the substrate in the second sub-first region and second region below the first and second dielectric layers.

25. The method of claim 24 comprises:
forming a gate electrode layer over the substrate; and
patterning to form first, second and third gate structures in the first and second sub-first regions and the second region.

* * * * *